US012638637B2

(12) United States Patent
Caro et al.

(10) Patent No.: US 12,638,637 B2
(45) Date of Patent: May 26, 2026

(54) COUPON WAFER AND METHOD OF PREPARATION THEREOF

(71) Applicant: ROCKLEY PHOTONICS LIMITED, Altrincham (GB)

(72) Inventors: Ludovic Caro, Cork (IE); Guomin Yu, Glendora, CA (US)

(73) Assignee: Rockley Photonics Limited, Altrincham (GB)

( * ) Notice: Subject to any disclaimer, the term of this patent is extended or adjusted under 35 U.S.C. 154(b) by 475 days.

(21) Appl. No.: 18/250,348

(22) PCT Filed: Sep. 27, 2021

(86) PCT No.: PCT/EP2021/076459
§ 371 (c)(1),
(2) Date: Apr. 24, 2023

(87) PCT Pub. No.: WO2022/089856
PCT Pub. Date: May 5, 2022

(65) Prior Publication Data
US 2023/0420305 A1      Dec. 28, 2023

Related U.S. Application Data

(60) Provisional application No. 63/105,775, filed on Oct. 26, 2020.

(30) Foreign Application Priority Data

Dec. 15, 2020    (GB) ...................................... 2019783

(51) Int. Cl.
 H10H 20/01        (2025.01)
 B41F 16/00        (2006.01)
  (Continued)

(52) U.S. Cl.
 CPC .......... G02B 6/136 (2013.01); B41F 16/0046 (2013.01); G02B 6/12 (2013.01);
  (Continued)

(58) Field of Classification Search
 CPC .......... G02B 6/136; G02B 6/132; G02B 6/42; H01L 21/6835; H01L 21/7813;
  (Continued)

(56) References Cited

U.S. PATENT DOCUMENTS 11,650,082 B2 *  5/2023  Kadoguchi  ............ G01D 5/147
                                                          198/502.3
2015/0327388 A1  11/2015  Menard et al.
                      (Continued)

OTHER PUBLICATIONS

U.K. Intellectual Property Office Search Report, dated May 27, 2021, for Patent Application No. GB2019783.6, 4 pages.
(Continued)

*Primary Examiner* — David Vu
*Assistant Examiner* — Brandon C Fox
(74) *Attorney, Agent, or Firm* — Womble Bond Dickinson (US) LLP

(57)        ABSTRACT

A coupon wafer for a micro-transfer printing process. The coupon wafer including a device coupon attached to a substrate of the coupon wafer by one or more tethers; wherein the or each tether is a pillar extending at least partially through the device coupon to contact the substrate of the coupon wafer.

17 Claims, 9 Drawing Sheets

(51) Int. Cl.

| | |
|---|---|
| *G02B 6/12* | (2006.01) |
| *G02B 6/122* | (2006.01) |
| *G02B 6/132* | (2006.01) |
| *G02B 6/136* | (2006.01) |
| *G02B 6/42* | (2006.01) |
| *G02B 6/43* | (2006.01) |
| *H01L 21/78* | (2006.01) |
| *H10D 84/05* | (2025.01) |
| *H10P 72/70* | (2026.01) |
| *H10P 95/00* | (2026.01) |
| *H10W 72/00* | (2026.01) |
| *H10W 74/01* | (2026.01) |

(52) U.S. Cl.
CPC ............. *G02B 6/122* (2013.01); *G02B 6/132* (2013.01); *G02B 6/4207* (2013.01); *G02B 6/43* (2013.01); *H10D 84/05* (2025.01); *H10P 72/74* (2026.01); *H10P 95/112* (2026.01); *H10W 72/0198* (2026.01); *H10W 74/014* (2026.01); *H10P 72/7428* (2026.01)

(58) Field of Classification Search
CPC ........... H01L 24/97; H01L 2221/68354; H01L 2224/95001; H01L 21/7806; H01L 2221/68318; H01L 2221/6835; H01L 2221/68368; H10D 84/05; H10H 20/018; H10H 20/01

See application file for complete search history.

(56) References Cited

U.S. PATENT DOCUMENTS

| | | | |
|---|---|---|---|
| 2016/0086855 A1* | 3/2016 | Bower ................ | H01L 21/6835 257/798 |
| 2016/0133496 A1 | 5/2016 | Lambert et al. | |
| 2019/0067164 A1 | 2/2019 | Noma et al. | |
| 2019/0305179 A1 | 10/2019 | Roelkens | |
| 2019/0393201 A1 | 12/2019 | Caplet et al. | |
| 2023/0105335 A1* | 4/2023 | Yang .................... | H10F 71/127 428/216 |

OTHER PUBLICATIONS

International Search Report and Written Opinion of the International Searching Authority, mailed Dec. 21, 2021, corresponding to PCT/EP2021/076459, 13 pages.

* cited by examiner

COUPON WAFER AND METHOD OF PREPARATION THEREOF

CROSS-REFERENCE TO RELATED APPLICATION(S)

This application is a U.S. national stage entry, under 35 U.S.C. § 371, of International Application Number PCT/EP2021/076459, filed on Sep. 27, 2021, which (i) claims priority to and the benefit of U.S. Provisional Application No. 63/105,775, filed in the U.S. Patent and Trademark Office on Oct. 26, 2020, and (ii) claims priority to United Kingdom Patent Application Number 2019783.6, filed in the United Kingdom Intellectual Property Office on Dec. 15, 2020; the entire contents of all of the documents identified in this paragraph are incorporated herein by reference.

FIELD OF THE INVENTION

The present invention relates to a coupon wafer and a method of preparation thereof.

BACKGROUND

Hybrid integration of different material systems is an area of great interest for photonic devices. For example, hybrid integration of III-V semiconductor based electro-optical devices (e.g. lasers, modulators, and amplifiers), with silicon-on-insulator (SOI) platforms confers the advantage of combining the best parts of both materials systems.

However, the conventional chip bonding processes typically use flip-chip bonding, in which the III-V semiconductor based device is inverted and bonded into a cavity on the 501 platform. The manufacturing process can be costly and have a low yield, because of the metal bumping requirements for the die bonding and difficulties in accurately controlling the alignment of the respective components.

Micro-transfer printing (MTP) is therefore being investigated an alternative way to integrate III-V semiconductor based devices within an 501 wafer. In these methods, the III-V semiconductor based device is fabricated on a device wafer. It can then be picked up using a stamp (typically formed of elastomer) and printed into a cavity on the 501 wafer in the same orientation in which it was manufactured and without the need for metal bumping. The alignment between the III-V semiconductor based device and the waveguides in the 501 platform are thereby predetermined in the vertical direction (z direction). The requirements for alignment are therefore reduced from three dimensions to two, which can be more easily facilitated.

One aspect of the MTP process is the tethering of device coupons. The device coupon is formed on or from a coupon wafer, and attached to the substrate via one or more perimeter tethers. Perimeter tethers extend across an upper surface of the device coupon and down one or more vertical sides thereof to contact the substrate of the coupon wafer. When the device coupon is released from the coupon wafer (by removal of a separation layer), it is tethered to the wafer by the tethers and so is ready for pick-up. However these perimeter tethers reduce the device coupon density across the wafer, and can cause additional failure modes (adhesion to the wafer after release, misalignment during printing, etc.).

There is a desire then to improve the MTP process, to improve the volume and yield so as to render the process commercially viable.

SUMMARY

Accordingly, in a first aspect, embodiments of the invention provide a coupon wafer for a micro-transfer printing process, the coupon wafer including a device coupon attached to a substrate of the coupon wafer by one or more tethers; wherein the or each tether is a pillar extending at least partially through the device coupon to contact the substrate of the coupon wafer.

By providing tethers in the form of one or more pillars, the device coupon density on a coupon wafer can be increased as perimeter tethers are not necessary. Accordingly, the failure modes associated with the perimeter tethers can also be avoided. Moreover, pillars can minimise the risk of a device coupon bending or collapsing and so allows device coupons of a larger form factor to be fabricated.

The coupon wafer may have any one or, to the extent that they are compatible, any combination of the following optional features.

The device coupon may comprise a waveguide. The device coupon may comprise an electro-optically active region or component. The device coupon may be a III-V semiconductor based device coupon. By III-V semiconductor based it may be meant that the device coupon comprises one or more III-V semiconductor layers. The device coupon may comprise a mirror. For example the device coupon may comprise a reflective surface (e.g. metal surface) configured to reflect light.

The pillar(s) may be located in central portions of the device coupon. That is, the pillar(s) may be located away from one or more lateral edges of the device coupon.

The pillar may extend through the entire device coupon. The pillar may extend from a surface of the device coupon furthest from the substrate to the substrate.

The pillar may be formed of a liner, which lines a hole which extends through the device coupon.

The pillar may include a filler, which fills the hole. The filler may be formed of: benzocyclobutene, a benzocyclobutene adhesive, a benzocyclobutene resin, polyimide, or silicon dioxide. The filler may be a dielectric. A portion of the filler may directly abut the device coupon. The filler may be a photoresist.

The pillar may be formed of a single material. For example, the pillar may be formed entirely from silicon nitride.

The pillar may include a first region having a first width, and a second region having a second width which is narrower than the first width, wherein the second regions is located between the first region and the substrate.

The pillar may be lined with a liner. The liner may be formed of a nitride-based material. The liner may be formed of silicon nitride. The liner may be formed from a material which is not etched by any etchant used to remove the release layer.

The pillar may have a T shape. The T shape may be evident when viewed in cross-section. The bar of the T may be the distalmost portion of the pillar relative to the substrate of the coupon wafer. The pillar may have a screw or nail shape, e.g. the pillar may have a thin body and a wide top or upper portion. The pillar may have a screw or nail shape when viewed in three-dimensions.

The pillar may extend no further than an uppermost surface of the device coupon. This can help ensure a more reliable pick-up during the micro-transfer printing process as the pillar does not protrude relative to the device coupon.

The pillar may comprise a retained region and a separable region, wherein the separable region is located between the substrate and the retained region and connected to the retained region via a removable portion. The retained region may directly contact the device coupon, whereas the separable portion may be separated from the device coupon by a liner and/or the removable portion. In use, the separable region is separated from the retained region by removal of the removable portion. This results in a device coupon which does not require a pillar recess in the corresponding platform wafer. The retained region may be formed from the same, or a different, material to the separable region. In some examples the separable region is formed from a different material to the retained region and so would demonstrate different etching properties.

The device may include only a single pillar. In such an example, the device may include one or more perimeter tethers. The device coupon may include at least two pillars. The device coupon may include at least three pillars.

The device coupon may include one or more perimeter tethers, the perimeter tethers extending horizontally from the device coupon to secure the device coupon to the coupon wafer.

The coupon wafer may further comprise a release layer, located between the device coupon and the substrate, and wherein the or each pillar extends through the release layer. The or each pillar may be formed of a different material to the release layer.

In a second aspect, embodiments of the present invention provide a method of preparing a coupon wafer for a micro-transfer printing process, the coupon wafer including a device coupon, the method comprising:

(a) etching a hole through the device coupon and a release layer, so as to expose a region of a substrate of the coupon wafer; and (b) forming a pillar in the hole, the pillar providing a tether which attaches the device coupon to the substrate.

By forming the tethers in the form of one or more pillars, the device coupon density on a coupon wafer can be increased as perimeter tethers are not necessary. Accordingly, the failure modes associated with the perimeter tethers can also be avoided.

The method of the second aspect may have any one or, to the extent that they are compatible, any combination of the following optional features.

The method may further include a step, performed before step (b), of lining the hole with a liner, and wherein step (b) includes depositing a filler into the lined hole to form the pillar. The release layer may be located between the substrate and the device coupon.

The method may include a step of etching away the release layer.

The method may further include a step of performing an ashing etch, to remove a portion of the or each pillar.

In a third aspect, embodiments of the invention provide a platform wafer, the platform wafer comprising a cavity suitable for receiving a device coupon, wherein the cavity includes one or more pillars recesses in a bed thereof for receiving one or more pillars located in the device coupon.

The platform wafer may be silicon based. For example, the cavity may be formed in a silicon device layer of a silicon-on-insulator wafer.

In a fourth aspect, embodiments of the invention provide an optoelectronic device comprising a device coupon bonded to the cavity of the platform wafer of the third aspect.

In a fifth aspect, embodiments of the invention provide a device coupon comprising a pillar which extends at least partially through the device coupon. The device coupon may comprise a waveguide and/or an electro-optically active region.

In a sixth aspect, embodiments of the invention provide a method of micro-transfer printing, using the coupon wafer of the first aspect, the method including adhering the device coupon to a stamp and lifting it away from the coupon wafer. The method may further comprise a step of depositing the device coupon onto a platform wafer.

The method may include a step, performed before lifting the device coupon away from the coupon wafer, of performing an isotropic plasma etch. This plasma etch can reduce the surface of contact between the device coupon and coupon wafer, and so weaken the mechanical connection between the two. The plasma etch can be performed to the point of completely undercutting the coating between the pillar filler and substrate, breaking the connection.

The invention includes the combination of the aspects and preferred features described except where such a combination is clearly impermissible or expressly avoided.

Herein, upper typically refers to a direction away from the substrate of the coupon wafer, and lower refers to a direction towards the substrate of the coupon wafer. Lateral typically refers to directions across the plane of the substrate; that is transversal to the vertical direction defined by the upper and lower directions.

Further aspects of the present invention provide: a computer program comprising code which, when run on a computer, causes the computer to perform the method of the second or sixth aspects; a computer readable medium storing a computer program comprising code which, when run on a computer, causes the computer to perform the method of the second or sixth aspect; and a computer system programmed to perform the method of the second or sixth aspect.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES

Aspects and embodiments of the present invention will now be discussed with reference to the accompanying figures. Further aspects and embodiments will be apparent to those skilled in the art.

Figure 1A:
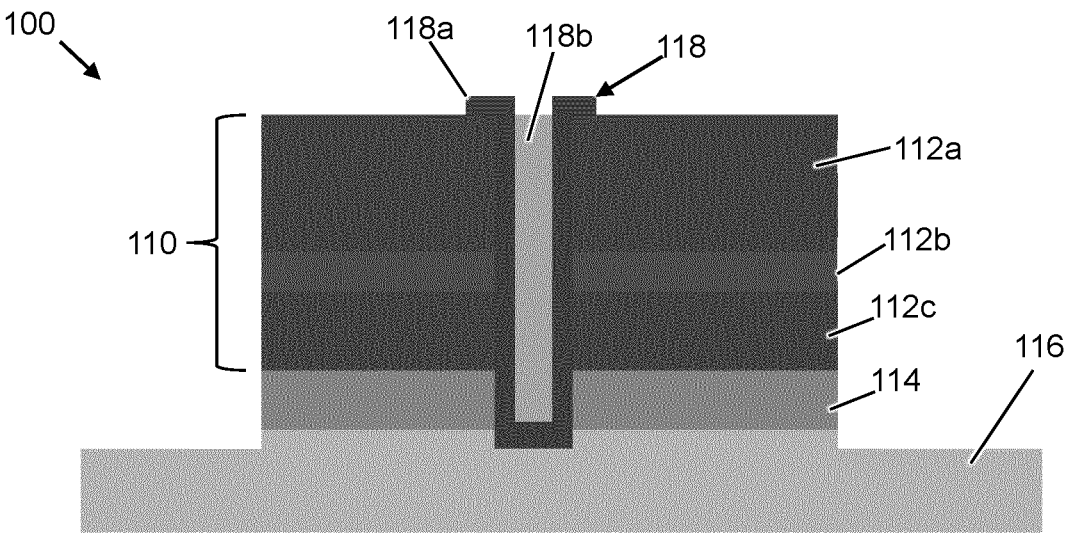
FIGS. 1A and 1B show cross-sectional views through a coupon wafer pre and post release respectively.
Figure 1B:
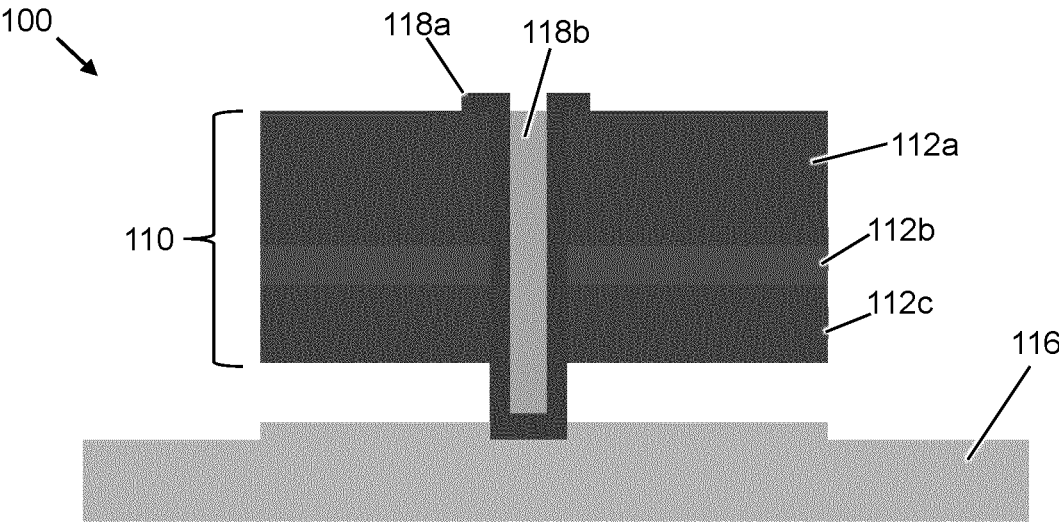

FIGS. 1A and 1B show cross-sectional views through a coupon wafer 100 pre and post release respectively. As shown in FIG. 1A, which is pre-release, the coupon wafer includes a device coupon 100. The device coupon in this example comprises three layers: 112a-112c, for example III-V semiconductor layers. In one example layers 112b is an undoped layer, and layers 112a and 112c are doped layers of opposite polarity so as to form a P-I-N junction. Accordingly, the device coupon may be operable as an electorabsorption modulator. The device coupon typically includes a waveguide.

Pre-release, the device coupon 110 is attached to a substrate 116 of the coupon wafer via a release layer 114 and a pillar 118. The pillar 118 extends through the device coupon 110 from an upper or uppermost surface (i.e. one distal or distalmost from the substrate) through layers 112a-112c and release layer 114 so as to contact the substrate 116. The pillar 118 in this example comprises a liner 118a, which directly abuts the layers 112a-112c of the device coupon 110, and a filler 118b which is at least partially enclosed by the liner 118a. The liner in this example is formed of silicon nitride, and the filler is formed of: benzocyclobutene, polyimide, silicon dioxide, or photoresist.

To release the device coupon 110, an etch is performed which selectively etches only the release layer 114. For example, an etchant such as iron chloride can be used to remove the release layer. The release layer may be, for example, from AlGaAs, InGaAs, or AlInAs. The result of the release etch is shown in FIG. 1B, whereupon the device coupon 110 is tethered to the substrate 116 of the coupon wafer 100 solely by pillar 118. Whilst not shown in FIG. 1B, being a cross-section, a plurality of pillars may be disposed through the device coupon 110 at different locations.

The device coupon 110 is then ready to be lifted off of the coupon wafer 100, for example through use of an elastomer stamp. In doing so, the pillar 118 detaches from the substrate 116 and the device coupon 110 is ready for depositing onto a platform wafer.

Figure 2A:
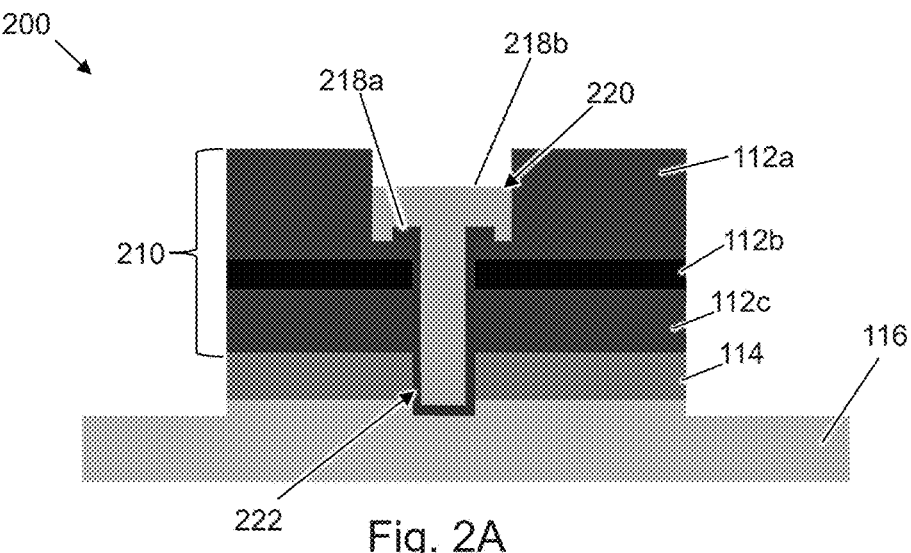
FIGS. 2A-2C show cross-sectional views through a variant coupon wafer during a release process.
Figure 2B:
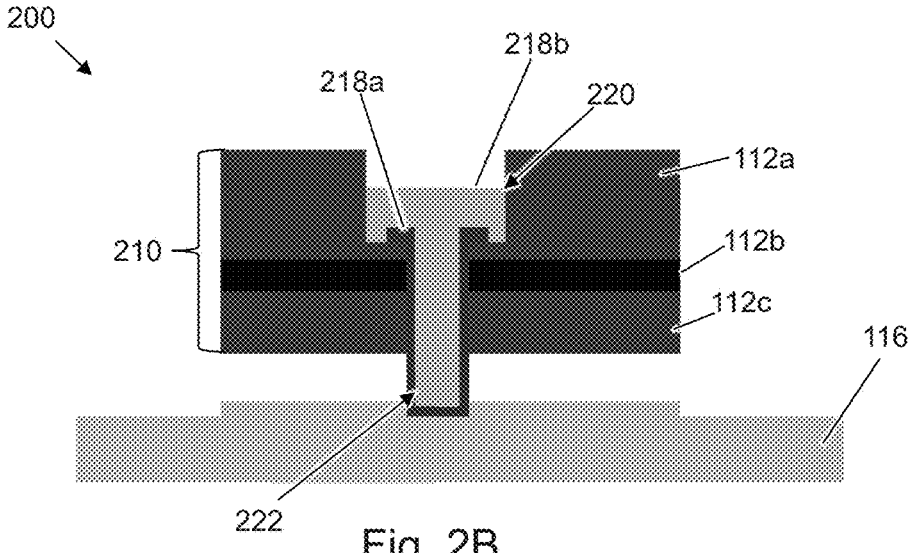
Figure 2C:
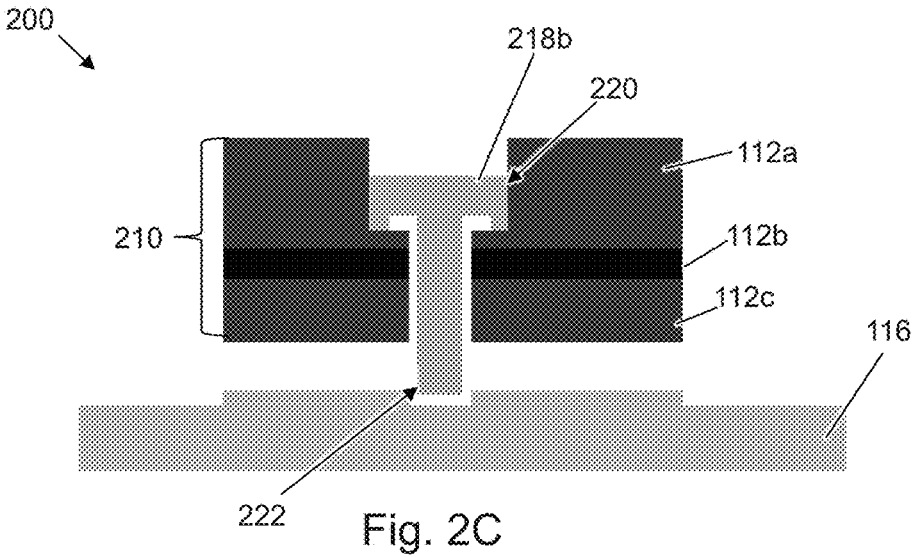

FIGS. 2A-2C show cross-sectional views through a variant coupon wafer 200 during a release process. Where the variant in FIGS. 2A-2C shares features with the coupon wafer(s) discussed previously, like features are indicated by like reference numerals. The variant 200 shown in FIG. 2A differs from that shown in FIG. 1A in that the pillar includes a first region 220 and a second region 222 of different widths. The first region 220, which is located above the second region 222, is wider than the second region 222. The second region 222 is narrower than the first, and so the entire pillar, when viewed in cross-section has a 'T' shape. In a three-dimensional view, the pillar may resemble a pin or bolt with first region 220 forming the head and the second region 222 forming the shank.

The example shown in FIG. 2A includes, as before, a liner 218a and filler 220. However, in contrast to the example shown in FIG. 1A, the filler 220 directly abuts portions of the device coupon 210. The first region provides a step within the device cavity. Whilst the example shown includes filler contacting the step and sidewalls, in other examples it contacts only the sidewalls within the hole. The coupon wafer 200 after a first stage of the release process, where the release layer 114 is etched away, is shown in FIG. 2B. As before, the device coupon 210 is now attached to the substrate 116 solely by the pillar(s). Next, a plasma ashing process is performed (for example an isotropic plasma etch). This ashing process only removes the liner 218a, as the liner 218a in this example is formed from silicon nitride. However any suitable material can be used, as long as it can be removed by an ashing process which does not affect the residual structure of the device coupon 210 and the filler 218b. The result of the ashing process is shown in FIG. 2C.

It is evident now why filler 218b directly abuts portions of the device coupon, as the liner 218a has been entirely removed by the ashing process. Advantageously, this further weakens the connection between the device coupon 210 and the substrate 216 and so increases the likelihood of a successful lift during the micro-transfer printing process.

Figure 3A:
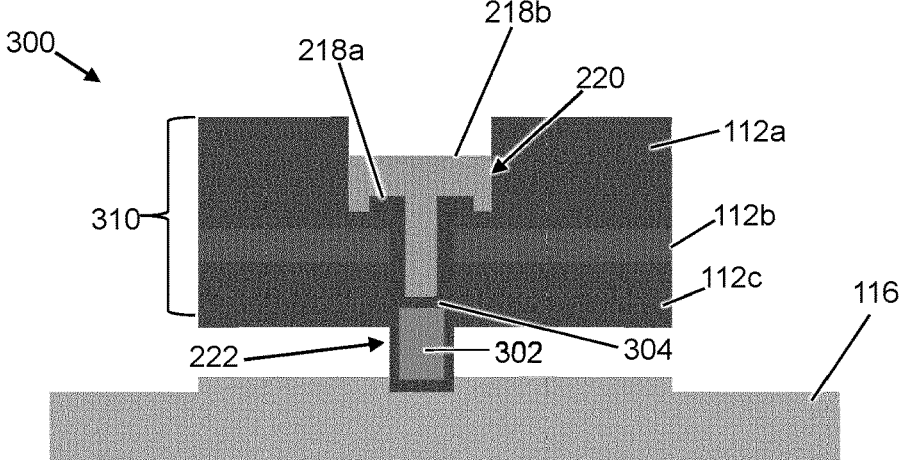
FIGS. 3A-3E show cross-sectional views through a variant coupon wafer during a release process.

FIGS. 3A-3E show cross-sectional views through a variant coupon wafer 300 during a release process. Where the variant in FIGS. 3A-3C shares features with the coupon wafer(s) discussed previously, like features are indicated by like reference numerals. The variant coupon wafer 300 shown in FIG. 3A differs from the variant shown in FIG. 2A in that the pillar is formed of two volumes. The lower, second region 222 of the pillar includes a separable region 302 and removable region 304. The upper, first region 220 includes a retained region formed of filler 218b and liner 218a, which is wider than the lower, second region 222. The separable region 302 is spatially separated from the filler 218a by the removable region 304 which is, in this example, provided as a portion of liner 218a. The coupon wafer 300 in FIG. 3A is shown after the release layer 114 is etched away in the manner discussed previously.

Figure 3B:
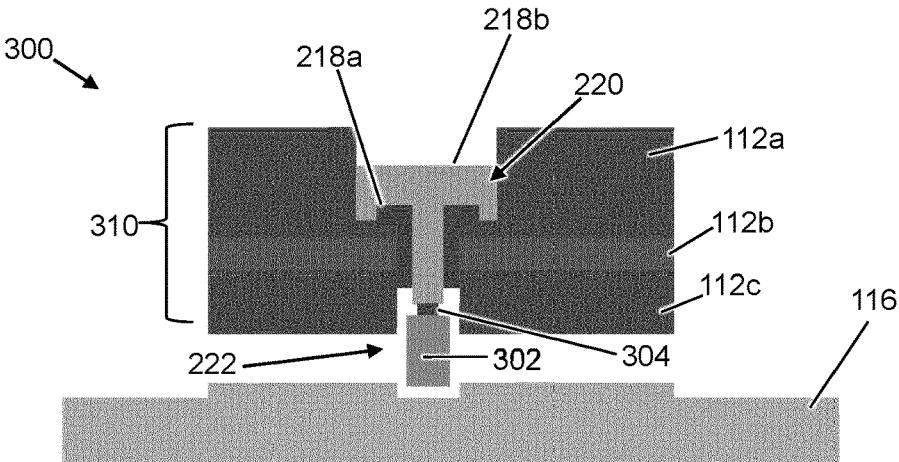
Figure 3C:
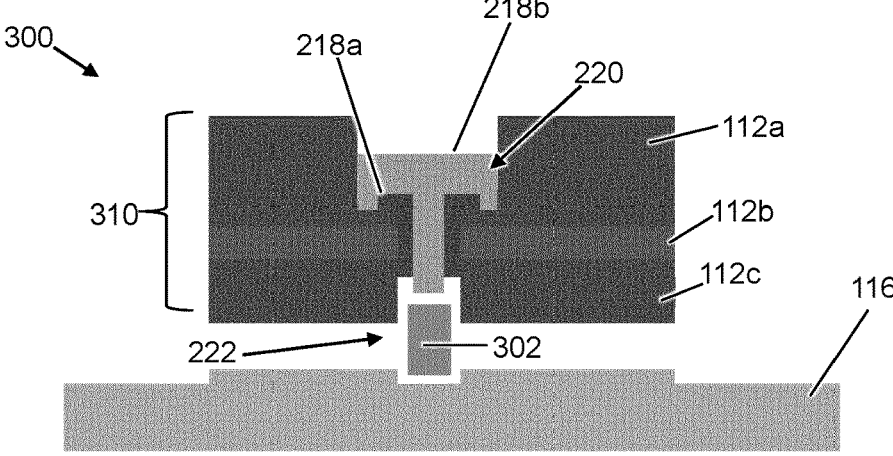
Figure 3D:
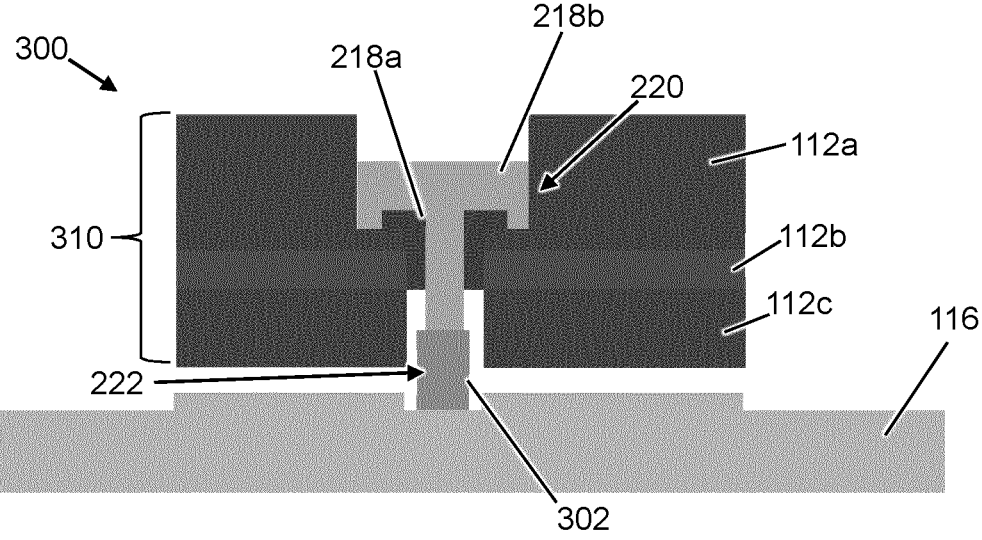
Figure 3E:
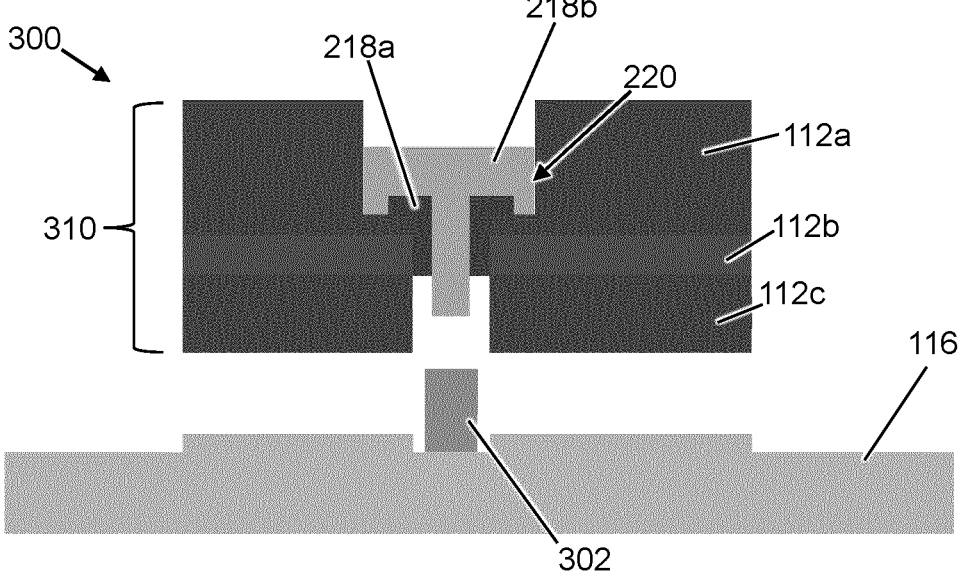

After the release layer has been etched away, a partial ashing process is applied which begins to remove the liner 218b. The result of this is shown in FIG. 3B. Further ashing is then applied, and the removable region 304 is entirely etched away thereby separating separable region 302 from the filler 218b. The device coupon 310 then settles due to gravity, as shown in FIG. 3D, with the device coupon 310 now resting on top of separable region 302. The retained region, comprising the first region and the portion of the second region not including the removable region 304 and separable region 302, is retained in the device coupon. This allows the device coupon 310 to be picked up, as shown in FIG. 3E, leaving the separable region 302 on the substrate 116 of the coupon wafer 300.

Figure 4A:
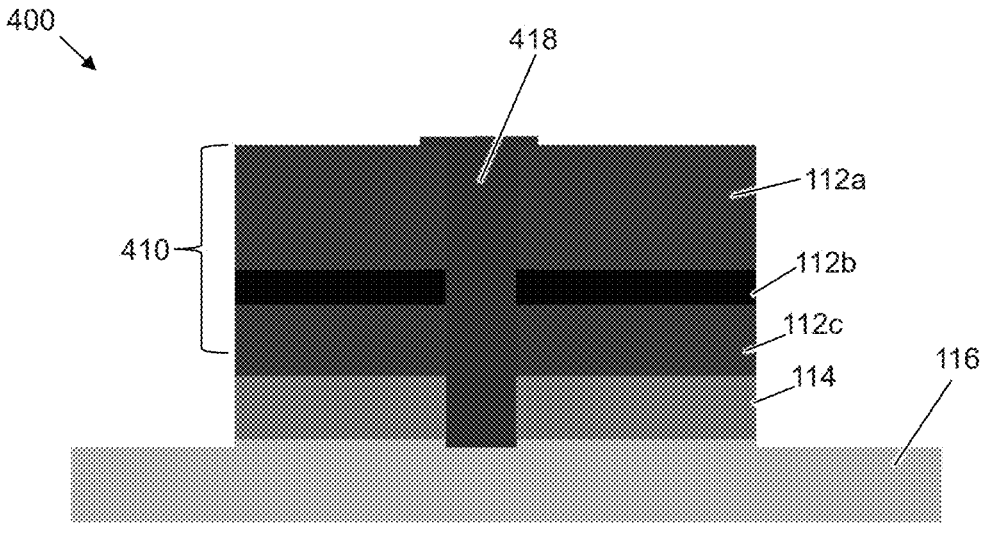
FIGS. 4A and 4B show cross-sectional views through a variant coupon wafer pre and post release respectively.
Figure 4B:
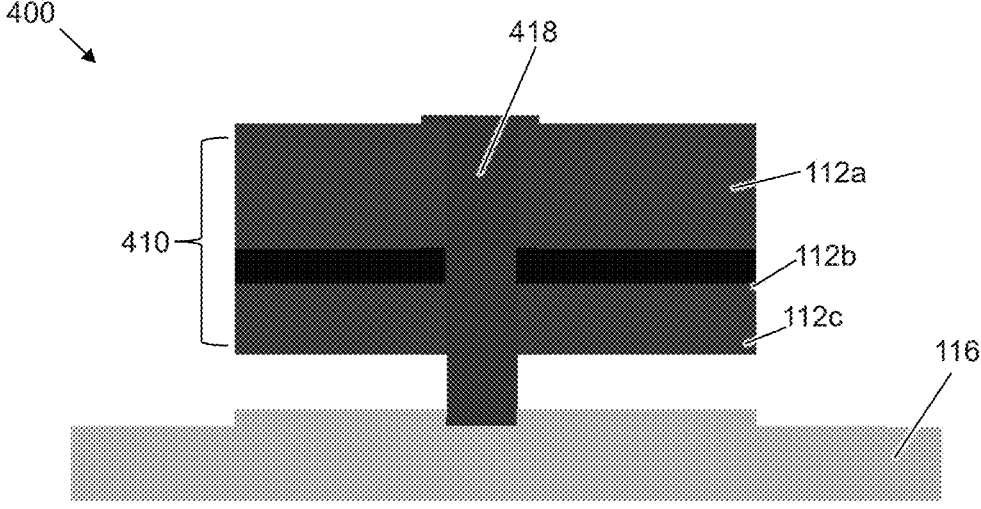

FIGS. 4A and 4B show cross-sectional views through a variant coupon wafer 400 pre and post release respectively. Where the variant in FIGS. 4A and 4B shares features with the coupon wafer(s) discussed previously, like features are indicated by like reference numerals. The variant coupon wafer 400 shown in FIG. 4A differs from the variant shown in FIG. 1A in that the pillar is formed from a single material. In this example it is formed entirely from a nitride-based material, e.g. silicon nitride. FIG. 4A shows the coupon wafer 400 before the release layer 114 is removed. After it has been removed, as shown in FIG. 4B, the device coupon 410 is attached to the substrate 116 solely via pillar 418. A partial ashing process can be applied to weaken the bond between the pillar 418 and substrate 116.

Figure 5A:
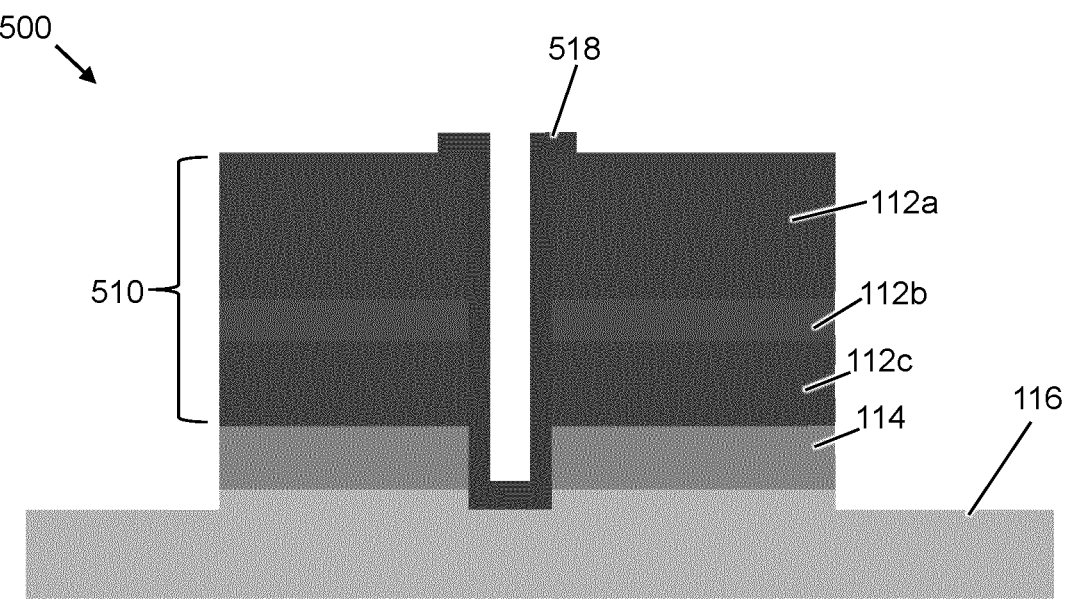
FIGS. 5A and 5B show cross-sectional views through a variant coupon wafer pre and post release respectively.
Figure 5B:
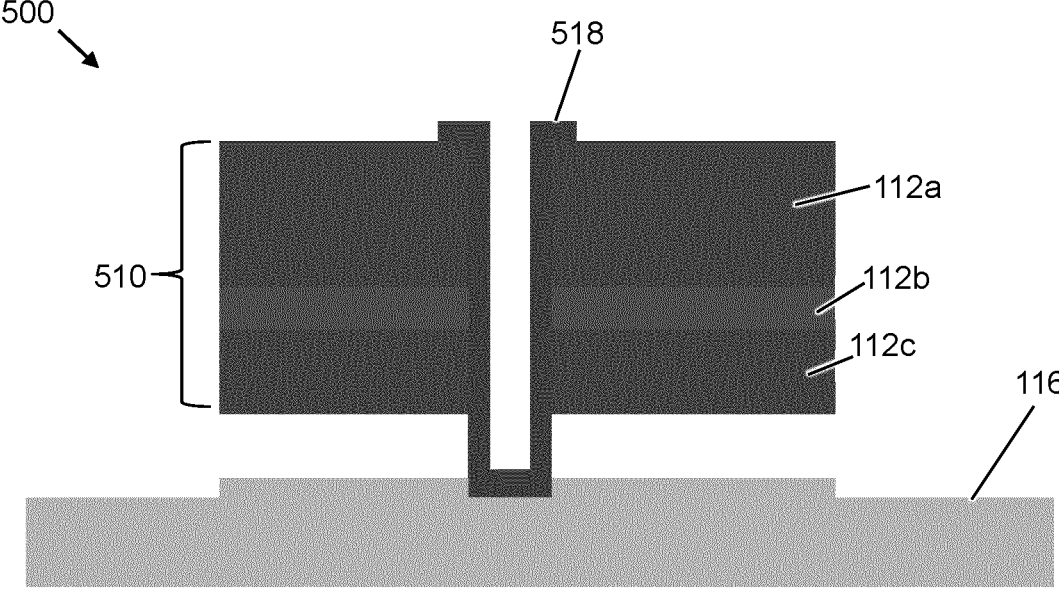

FIGS. 5A and 5B show cross-sectional views through a variant coupon wafer 500 pre and post release respectively. Where the variant in FIGS. 5A and 5B shares features with the coupon wafer(s) discussed previously, like features are indicated by like reference numerals. The variant coupon wafer 500 shown in FIG. 5A differs from the variant shown in FIG. 4A in that the pillar is hollow. In this example it is formed entirely from a nitride-based material, e.g. silicon nitride. FIG. 5A shows the coupon wafer 500 before the release layer 114 is removed. The pillar lines a hole in the device coupon 510, which is then left unfilled. After the release layer 114 has been removed, as shown in FIG. 5B, the device coupon 510 is attached to the substrate 116 solely via pillar 518. A partial ashing process can be applied to weaken the bond between the pillar 518 and substrate 116. By leaving the pillar 518 hollow, improved access is provided for subsequent ashing steps.

FIGS. 6A-6E show, variously, a top down view and cross-sectional views of a variant coupon wafer 600 during a release process. The coupon wafer 600 in this example includes three pillars: 604a-604c located in various parts of the device coupon 610. The device coupon 610 is also attached by eight perimeter tethers: 602a-602h to the substrate 116. A cross-sectional view along the line A-A' is shown in FIGS. 6B-6E.

Figure 6A:
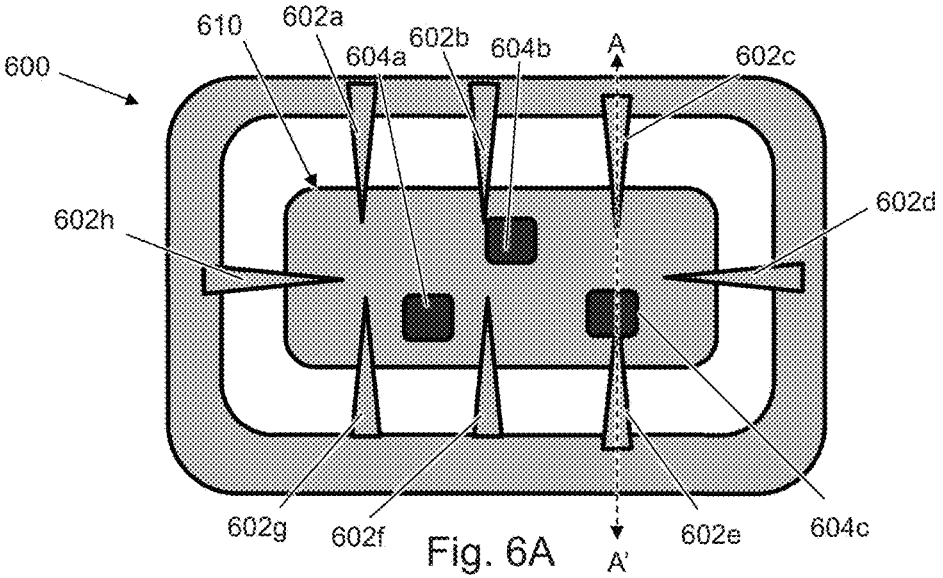
FIGS. 6A-6E show, variously, a top down view and cross-sectional views of a variant coupon wafer during a release process.
Figure 6B:
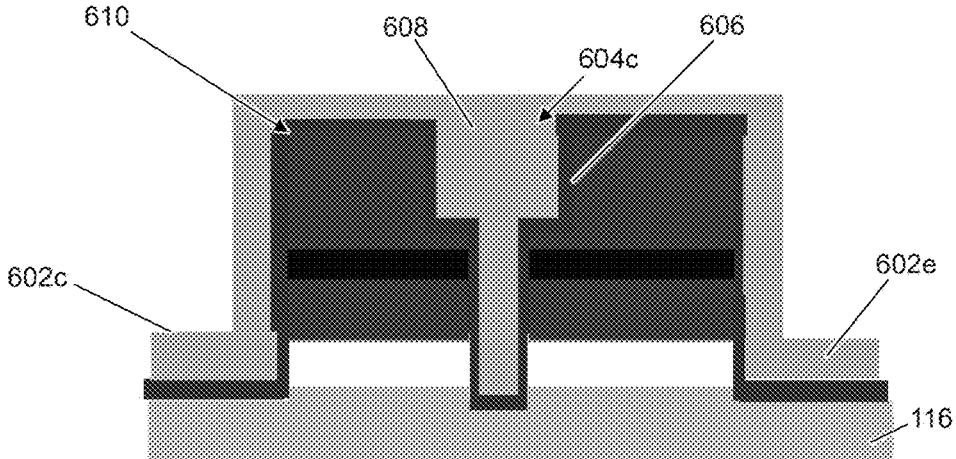
Figure 6C:
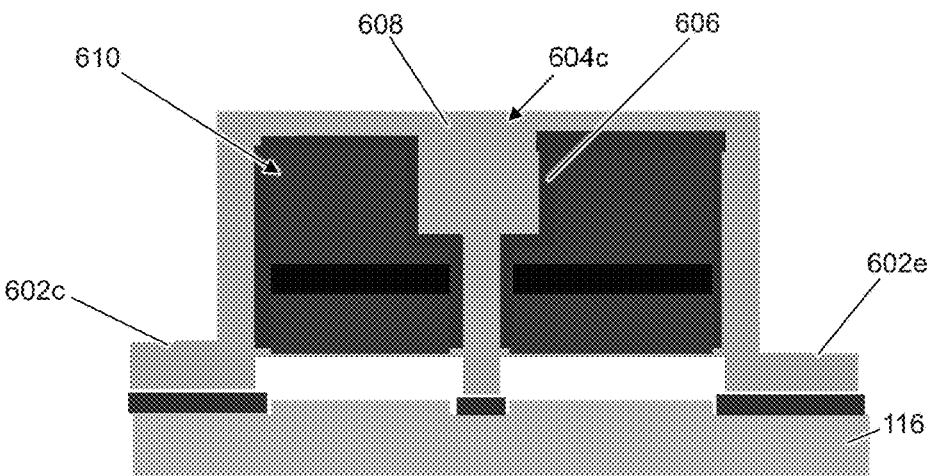
Figure 6D:
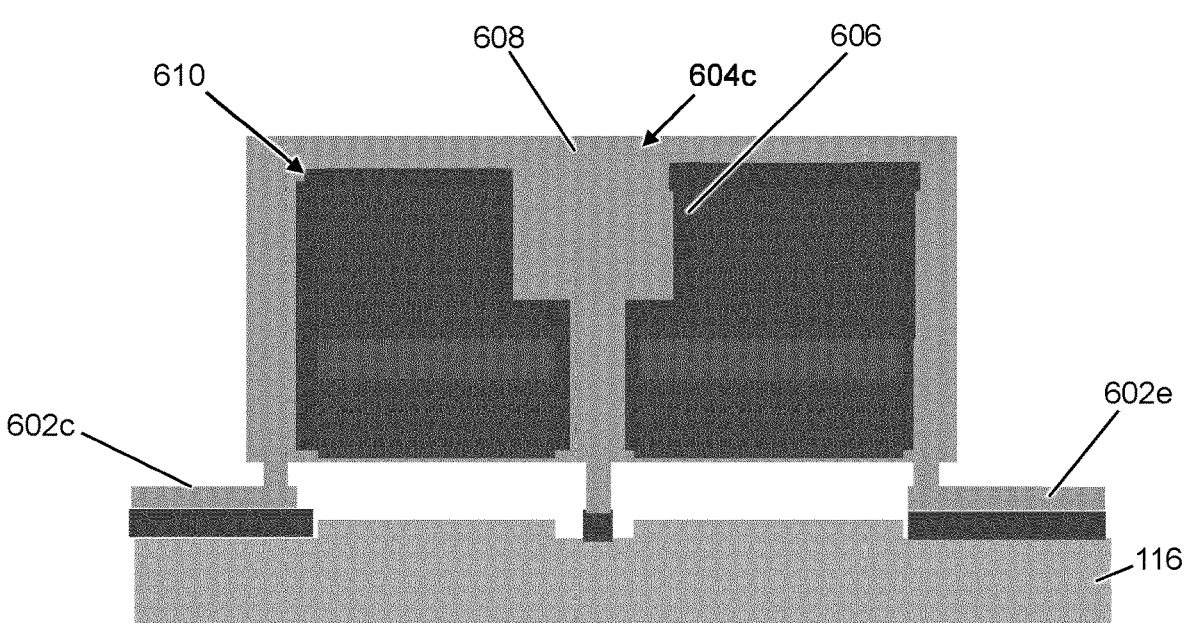
Figure 6E:
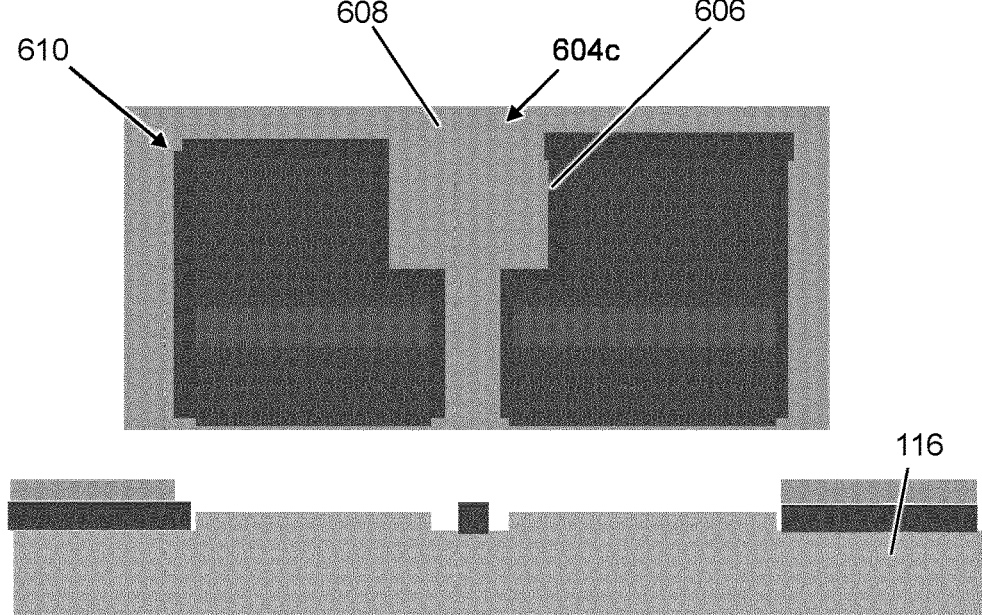

As with previous examples, pillar 604c extends through the device coupon 610 and contacts substrate 116. Liner 606, providing a portion of pillar 604c, also extends around the upper surface of device coupon 610 and across an upper surface of substrate 116 to provide the perimeter tethers 602c and 602e. FIG. 6B shows the coupon wafer after the release layer has been etched away. An initial ashing process is performed, the result of which is shown in FIG. 6C. The initial ashing process partially removes the exposed liner 606 as it is formed of silicon nitride. Further ashing is then performed, resulting in the structure shown in FIG. 6D. After the further ashing the device coupon 610 is picked up as shown in FIG. 6E, whereupon the perimeter tethers and pillars break allowing the device coupon 610 to be separated from the substrate. In this example the filler 608 is provided as photoresist. The liner 606 is shaped to match the perimeter tethers and the pillars and so both are formed by a two-material structure of nitride and photoresist.

Figure 7:
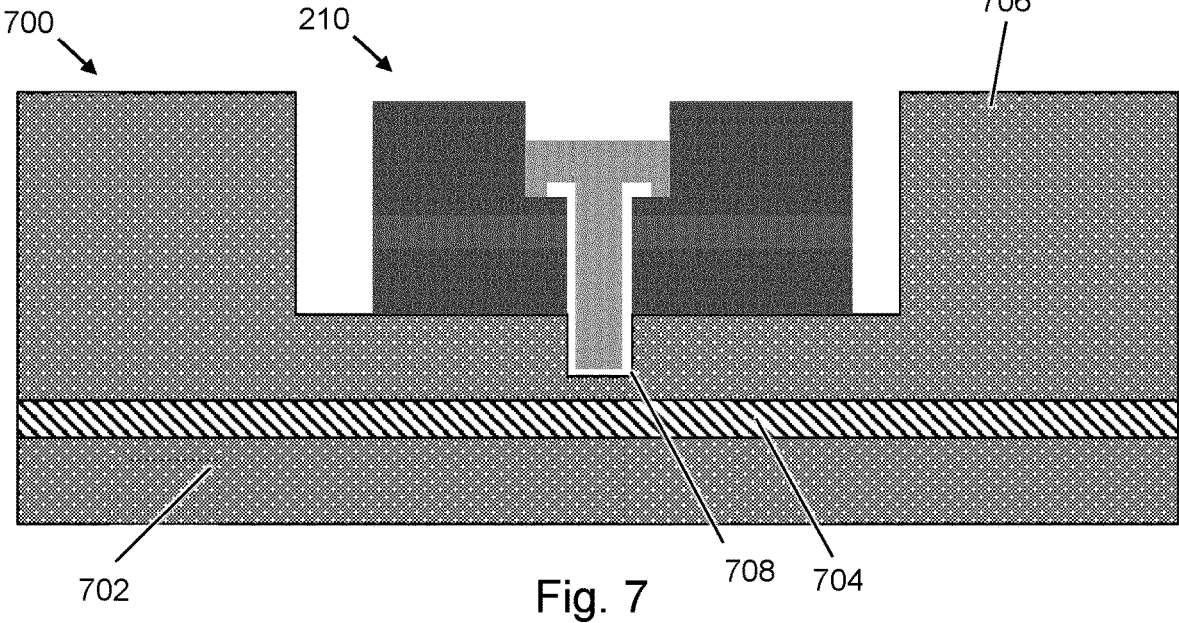
FIG. 7 shows a cross-sectional view of a platform wafer after the device coupon 710 of FIG. 2C has been printed onto it.

FIG. 7 shows a cross-sectional view of a platform wafer 700 after the device coupon 210 of FIG. 2C has been printed onto it. The platform wafer 700 is a silicon-on-insulator wafer and so comprises a silicon substrate 702, above which is an insulator layer (in this example a buried oxide) 704, and a silicon device layer 706 located above the insulator 704. A cavity is formed in the silicon device layer, and one or more pillar recesses 708 are formed in the bed of the cavity. When the device coupon 210 is printed into the cavity, the pillar(s) are located within respective pillar recesses.

The features disclosed in the description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For the avoidance of any doubt, any theoretical explanations provided herein are provided for the purposes of improving the understanding of a reader. The inventors do not wish to be bound by any of these theoretical explanations.

Any section headings used herein are for organizational purposes only and are not to be construed as limiting the subject matter described.

Throughout this specification, including the claims which follow, unless the context requires otherwise, the word "comprise" and "include", and variations such as "comprises", "comprising", and "including" will be understood to imply the inclusion of a stated integer or step or group of integers or steps but not the exclusion of any other integer or step or group of integers or steps.

It must be noted that, as used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by the use of the antecedent "about," it will be understood that the particular value forms another embodiment. The term "about" in relation to a numerical value is optional and means for example +/−10%.

LIST OF FEATURES

100, 200, 300, Coupon wafer
400, 500, 600 Coupon wafer
110, 210, 310 Device coupon
112a— c Device coupon layers
114 Release layer
116 Wafer substrate
118, 418, 518 Pillar
118a, 218a, 606 Liner
118b, 218b, 608 Filler
220 First region
222 Second region
302 Separable region
304 Removeable region
510, 610 Device coupon
602a-h Perimeter tether
604a-c Pillar
700 Platform wafer
702 Silicon substrate
704 Insulator/buried oxide layer
706 Device layer
708 Pillar recess

The invention claimed is:

1. A coupon wafer for a micro-transfer printing process, the coupon wafer including a device coupon attached to a substrate of the coupon wafer by one or more tethers, wherein the or each tether is a pillar extending at least partially through the device coupon to contact the substrate of the coupon wafer, wherein the pillar is formed of a liner, which lines a hole which extends through the device coupon, and wherein the pillar further includes a filler, which fills the hole.

2. The coupon wafer of claim 1, wherein the pillar extends through the entire device coupon, from a surface of the device coupon furthest from the substrate to the substrate.

3. The coupon wafer of claim 1, wherein the pillar is formed of a single material.

4. The coupon wafer of claim 1, wherein the pillar includes a first region having a first width, and a second region, having a second width which is narrower than the first width, wherein the second region is located between the first region and the substrate.

5. The coupon wafer of claim 1, wherein the pillar is lined with a liner.

6. The coupon wafer of claim 1, wherein the liner is formed of a nitride-based material.

7. The coupon wafer of claim 6, wherein the liner is formed of silicon nitride.

8. The coupon wafer of claim 1, wherein the pillar has a T shape.

9. The coupon wafer of claim 1, wherein the pillar comprises a retained region and a separable region, wherein the separable region is located between the substrate and the retained region and connected to the retained region via a removable portion.

10. The coupon wafer of claim 1, wherein the device coupon includes at least three pillars.

11. The coupon wafer of claim 1, wherein the device coupon further includes one or more perimeter tethers, the perimeter tethers extending horizontally from the device coupon to secure the device coupon to the coupon wafer.

12. The coupon wafer of claim 1, further comprising a release layer, located between the device coupon and the substrate, and wherein the or each pillar extends through the release layer.

13. The coupon wafer of claim 12, wherein the or each pillar is made of a different material to the release layer.

14. A method of preparing a coupon wafer for a micro-transfer printing process, the coupon wafer including a device coupon, the method comprising:

(a) etching a hole through the device coupon and a release layer, so as to expose a region of a substrate of the coupon wafer; and (b) forming a pillar in the hole, the pillar providing a tether which attaches the device coupon to the substrate, wherein the method further includes a step, performed before step (b), of lining the hole with a liner, and wherein step (b) includes depositing a filler into the lined hole to form the pillar.

15. The method of claim 14, the method further including a step of etching away the release layer.

16. The method of claim 14, wherein the method further includes a step of performing an ashing etch, to remove a portion of the or each pillar.

17. An optoelectronic device, comprising a device coupon bonded to a cavity of a platform wafer, the cavity being suitable for receiving the device coupon, and the cavity including one or more pillar recesses in a bed thereof for receiving one or more pillars located in the device coupon.

* * * * *